United States Patent
Haddad et al.

(10) Patent No.: US 6,542,838 B1
(45) Date of Patent: Apr. 1, 2003

(54) SYSTEM AND METHOD FOR PERFORMING AUTORANGING IN A MEASUREMENT DEVICE

(75) Inventors: Michel Haddad, Austin, TX (US); Mark Silva, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/569,862

(22) Filed: May 12, 2000

(51) Int. Cl.[7] .................. G01D 18/00; G01D 21/00; G01M 19/00; G01P 21/00; G01R 35/00
(52) U.S. Cl. ........................... 702/88; 702/127
(58) Field of Search .............. 702/88, 82; 341/139, 341/155; 364/481, 561; 368/118; 375/102; 73/861.28; 324/457

(56) References Cited

U.S. PATENT DOCUMENTS

| | | | | |
|---|---|---|---|---|
| 4,716,371 A | * | 12/1987 | Blitshteyn et al. | 324/457 |
| 4,731,768 A | * | 3/1988 | Easterday | 368/118 |
| 4,864,512 A | * | 9/1989 | Coulson et al. | 364/481 |
| 5,125,008 A | * | 6/1992 | Trawick et al. | 375/102 |
| 5,329,281 A | * | 7/1994 | Baumgartner et al. | 341/139 |
| 5,329,821 A | * | 7/1994 | Birnbaum et al. | 73/861.28 |
| 5,691,922 A | * | 11/1997 | McEwan et al. | 364/561 |
| 5,844,512 A | * | 12/1998 | Gorin et al. | 341/139 |
| 6,288,664 B1 | * | 9/2001 | Swanson | 341/155 |

FOREIGN PATENT DOCUMENTS

GB  0 581 426 A2 * 6/1993 .......... G01R/15/08

* cited by examiner

*Primary Examiner*—John Barlow
*Assistant Examiner*—Aditya Bhat
(74) *Attorney, Agent, or Firm*—Meyertons Hood Kivlin Kowert & Goetzel, P.C.; Jeffrey C. Hood (57) ABSTRACT

A system and method that configures a measurement device to a correct measurement range. The system and method implements an autoranging technique, preferably in software, that automatically determines a measurement range based on a measurement. Once an initial measurement is received, the initial measurement is compared with the current measurement range. If the current measurement range is the correct measurement range for the initial measurement, then the measurement device is already configured at the correct measurement range. However, if the current measurement range is found not to be the correct measurement range, then a new measurement range is determined based on the initial measurement. A new measurement is then taken using the new measurement range to ensure the new measurement range is the correct measurement range. The process repeats itself by comparing the new measurement with the new measurement range to see if the new measurement range, is the correct range. If the new measurement range is not the correct measurement range, then the process continues until a correct measurement range is found.

24 Claims, 4 Drawing Sheets

SYSTEM AND METHOD FOR PERFORMING AUTORANGING IN A MEASUREMENT DEVICE

FIELD OF THE INVENTION

The invention relates to the art of data acquisition devices, and more particularly, to autoranging techniques for automatically selecting a measurement range of a signal.

DESCRIPTION OF THE RELATED ART

Scientists and engineers often use test and measurement and data acquisition systems to perform a variety of functions, including laboratory research, process monitoring and control, data logging, analytical chemistry, test and analysis of physical phenomena and control of mechanical or electrical machinery, to name a few examples. One example of hardware to implement such measuring systems is a computer-based measurement system or data acquisition (DAQ) system. A computer-based measurement or DAQ system typically includes transducers for measuring and providing electrical signals, signal conditioning hardware which may perform amplification, isolation and/or filtering, and measurement or DAQ hardware for receiving digital and analog signals and providing them to a processing system, such as a personal computer. The computer may further include analysis hardware and software for analyzing and appropriately displaying the measured data.

As mentioned above, a measurement system may include one or more of a measurement or DAQ device comprised in or connected to a computer system. The device may be an I/O board plugged into one of the I/O slots of the processing or computer system. The measurement or DAQ device may also comprise an external device connected to a computer system. Exemplary hardware I/O (input/output) interface options include the GPIB (general purpose interface bus), the VXI bus, the PXI bus, or a serial bus such as the RS-232 protocol, IEEE 1394, or USB.

When a signal is desired to be measured, a measurement range is typically first selected before measuring the signal. The measurement range allows the measuring device to more accurately measure the signal. A measuring device typically implements multiple measurement ranges. For example, a measuring device may possess measurement ranges of 200 volts, 20 volts, 2 volts, 200 millivolts and 20 millivolts. When a 1.5 volt signal is being measured, the measuring device should use the 2 volt measurement range because the measuring device will more accurately be able to measure the 1.5 volt signal using the 2 volt measurement range than using other measurement ranges. For example, if the measuring device was set at the 20 volt measurement range, the measurement device would not be able to measure the 1.5 volt signal as accurately because 1.5 volts is very small in comparison to 20 volts. Furthermore, if the measuring device was set at the 200 millivolt measurement range, the measurement device would register an error because the 1.5 volt signal is outside of the 200 millivolt range.

When measuring a signal, measurement systems may implement an autoranging technique for automatically selecting a measurement range without user input. Thus, autoranging allows the system to automatically select the measurement range without requiring the user to manually select the measurement range. In one autoranging technique, the measurement system obtains a measurement at a default measurement range, such as the largest range. If the default measurement range is not the correct range with which to measure the signal, then the next measurement range will be tested with a new measurement to see if it is the correct range. If that range is not the correct range, then the next measurement range will be tested with a new measurement and so forth until the correct range is found. A disadvantage of this technique is the inefficiency of taking a new measurement in each tested measurement range before a correct measurement range is found.

It would therefore be desirable to develop a system and method that allows a measurement system to more quickly find a correct measurement range in measuring a signal.

SUMMARY OF THE INVENTION

The problems outlined above are in large part solved by a system and method that allows a measurement system to implement an autoranging technique, preferably in software, for automatically selecting a measurement range of a signal without requiring a new measurement in each tested measurement range.

A measurement device may be configured to a correct measurement range faster by implementing an autoranging system and method in software. Once an initial measurement or reading is received, the initial measurement is compared with a current measurement range. The method then determines if the initial measurement or reading is greater than the upper voltage of the current measurement range. If the initial measurement or reading is greater than the upper voltage of the current measurement range, then the reading is presumed inaccurate, since the current range may not have been sufficiently large to properly read the measurement. The method then sets the current range to the maximum range for the current measurement type. The method then configures the measurement device according to the new range and takes another reading using the new range.

If the initial measurement or reading is less than the upper voltage of the current measurement range, then the method determines if the current measurement range is correct, i.e., if the reading is greater than a pre-determined fraction of the next lower measurement range, e.g., 90% of the (current-1) measurement range. If the reading is greater than 90% of the (current-1) measurement range, then the current measurement range is the correct measurement range for the initial measurement. Thus, if the reading is less than the current measurement range and greater than 90% of the (current-1) measurement range, then the current measurement range is determined to be the correct measurement range. In this case, the measurement device is already configured at the correct measurement range, e.g., a default measurement range. The board may then be set up for the next reading, and operation completes.

If the reading is not greater than 90% of the (current-1) measurement range, then the current measurement range is not the correct measurement range for the initial measurement. In this case, a new measurement range is determined based on the initial measurement. Thus, the new measurement range is intelligently determined based on the initial reading, preferably by software executing in the computer system. The process of determining a new measurement range is preferably to take the initial reading and compare it to a certain percentage, such as 90%, of the next smaller measurement range with respect to the (current-1) measurement range, which would be the (current-2) measurement range. If the initial reading is less than 90% of this next smaller measurement range, then the initial reading is compared to 90% of the following smaller measurement range. The process continues until the initial reading is not less than 90% of a measurement range. When this occurs, the next higher measurement range is the correct measurement range.

For example, a measuring device may have five voltage measurement ranges such as a 0.02 volt, 0.2 volt, 2 volt, 25 volt and a 250 volt range. Suppose the measuring device takes an initial measurement of a signal which measures 1.7 volts. Suppose further that the current measurement range is the 250 volt measurement range. Two conditions are examined to determine whether the current measurement range is the correct measurement range, these being that the reading should be less than the current measurement range and greater than 90% of the (current-1) measurement range. The (current-1) measurement range is the next smaller measurement range with respect to the current measurement range. In the example, 1.7 volts is less than the (current-1) measurement range, i.e. 25 volts. Therefore, the 250 volt measurement range is not the correct measurement range. Since the current measurement range is not the correct measurement range, a new measurement range is determined based on the initial measurement. As described above, the process would compare the reading with 90% of subsequently smaller measurement ranges until the initial reading is not less than 90% of a measurement range. In this example, that would occur with a measurement range of 0.2 volts. That is, 1.7 volts exceeds 0.90 times 0.2 volts. When that occurs, the measurement range above the 0.2 measurement range, i.e., the 2 volt range, becomes the new measurement range and the measurement device is set according to the new measurement range.

The measurement device then configures the measurement device according to the new measurement range and preferably takes another reading of the signal in the new measurement range, e.g., the 2 volt measurement range, to verify that the new measurement range is the correct measurement range. Normally, the new measurement range is the correct measurement range. Occasionally, because of an offset in the measurement device, the new measurement range is not the correct measurement range and the above process may repeat one more time.

Another particular embodiment is a system which performs autoranging on a measurement device. The system comprises a measurement device for measuring signals where the measurement device includes a plurality of measurement ranges. The system further comprises a computer system coupled to the measurement device where the computer system includes a memory medium and a processor coupled to the memory medium. The memory medium stores an autoranging software program for configuring the measurement device with a correct measurement range. The measurement device is operable to receive a first measurement. In response to the first measurement, the processor is operable to execute the autoranging software program to perform the method described above.

In one embodiment, where a device has more than one channel and has an autoranging capability as described above, the device may operate to maintain or store the last range used on a channel-by-channel basis. This allows the device to return to the last range for a respective channel, thus allowing quicker auto-ranging for each channel.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
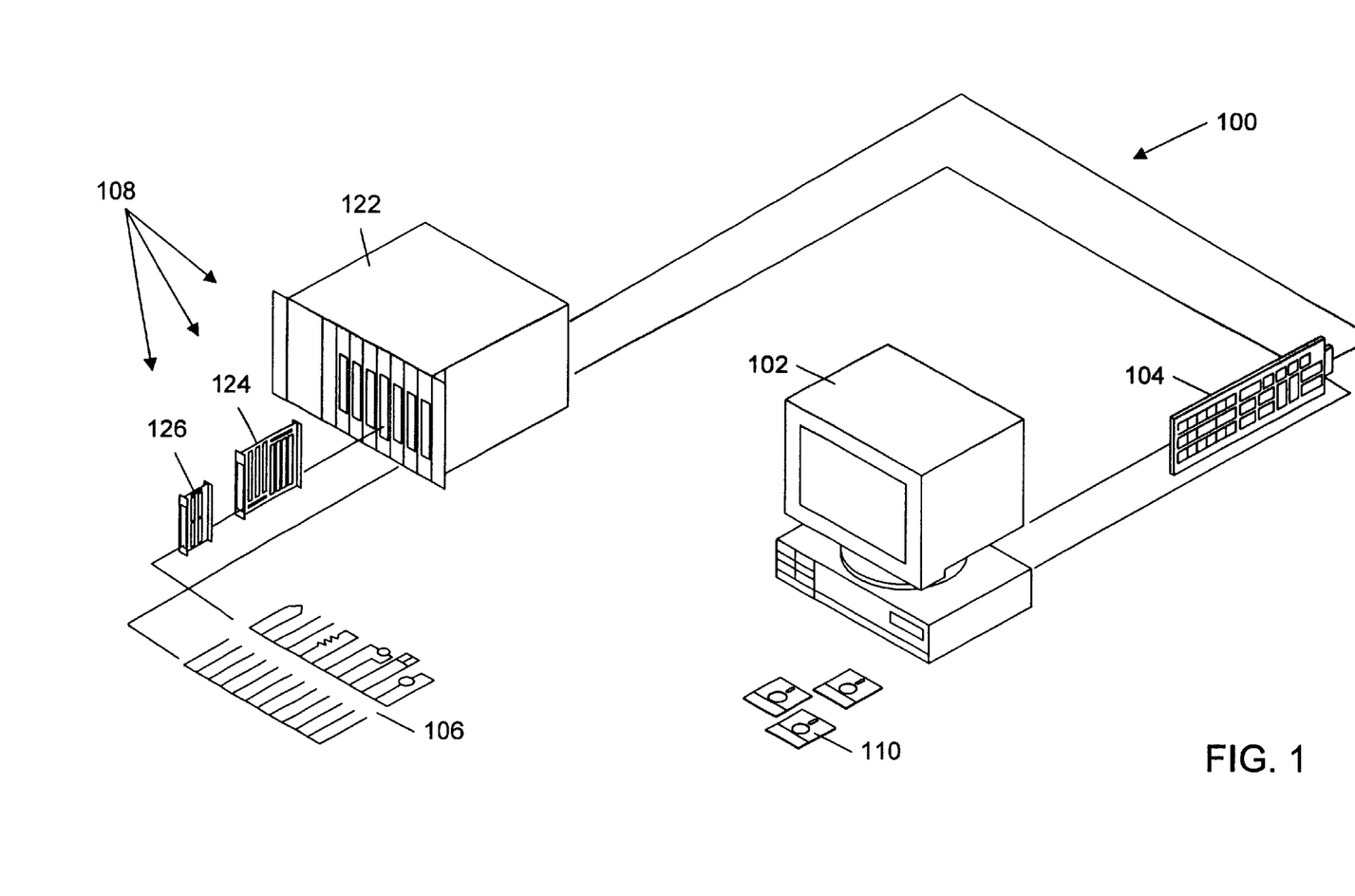
FIG. 1 illustrates an instrumentation system which includes a main memory implenting the present invention.

FIG. 1 illustrates a computer-based instrumentation system 100 according to one embodiment of the present invention. The system and method of the present invention is preferably comprised in the computer-based instrumentation system 100. However, the system and method of the present invention may also be comprised in a standard handheld or benchtop instrument, such as a standard multimeter, or in any of various other systems which use main memory. Examples of systems where the present invention may be used include instrumentation systems, industrial automation systems, audio systems, telephony systems, video systems, and other systems where measurements are performed. Thus FIG. 1 is an example of one embodiment, and the present invention may be used in any of various systems.

The instrumentation system 100 comprises a computer 102 having an operating system and other software, an instrumentation device or board 104 coupled to or comprised the computer 102, and transducers 106 or other detecting means which provide field electrical signals to/from the instrumentation device 104 through signal conditioning logic 108.

The computer 102 includes various standard components, including at least one central processing unit (CPU), memory, a non-volatile memory, one or more buses, and a power supply. In one embodiment, the computer 102 comprises input/output (I/O) slots into which the instrumentation device 104 is coupled. Alternatively, the device 104 is coupled to the computer, such as through a serial port or other communication medium. The computer also stores software programs, represented by medium 110, including software programs of the present invention.

The transducers 106 and other detecting means provide the field signals representing a process, physical phenomena, equipment being monitored or measured, etc. to/from the instrumentation device 104. Examples of the transducers 106 are strain gauges, thermocouples, thermistors, photoconductive cells, microphones, and piezoelectric transducers, among others.

The signals provided to the device 104 are optionally conditioned by the signal conditioning circuitry 108, as shown. In the embodiment of FIG. 1, the signal conditioning circuitry 108 comprises an SCXI (Signal Conditioning Extensions for Instrumentation) chassis 122, one or more SCXI modules 124, and one or more SCXI terminal blocks 126. SCXI is an open architecture, multi-channel signal conditioning frontend system for instrumentation devices. SCXI comprises an external chassis housing signal conditioning modules for amplifying, multiplexing, and isolating field signals. The signal conditioning modules advantageously reduce the introduction of noise into the signals transmitted to the device 104.

In the embodiment of FIG. 1, the instrumentation device 104 is a board or card adapted for insertion into an expansion slot of the computer system 102. The board 104 is shown external to the computer system 102 in FIG. 1 for illustrative purposes. In another embodiment, the instrumentation device 104 is external to the computer 102. For example, the device 104 may be coupled to the computer 102 by a VXI (VME Extensions for Instrumentation) chassis and bus, a GPIB (General Purpose Interface Bus), a serial bus or port, e.g., USB or IEEE 1394, a parallel port, or other type of bus or cabling. The instrumentation device 104 may be any of various types, such as a data acquisition (DAQ) device or card, a multimeter card, a voltmeter card, etc. In the embodiment of FIG. 1, the instrumentation device 104 is configured to receive measurements of signals including an initial measurement according to the present invention.

Figure 2:
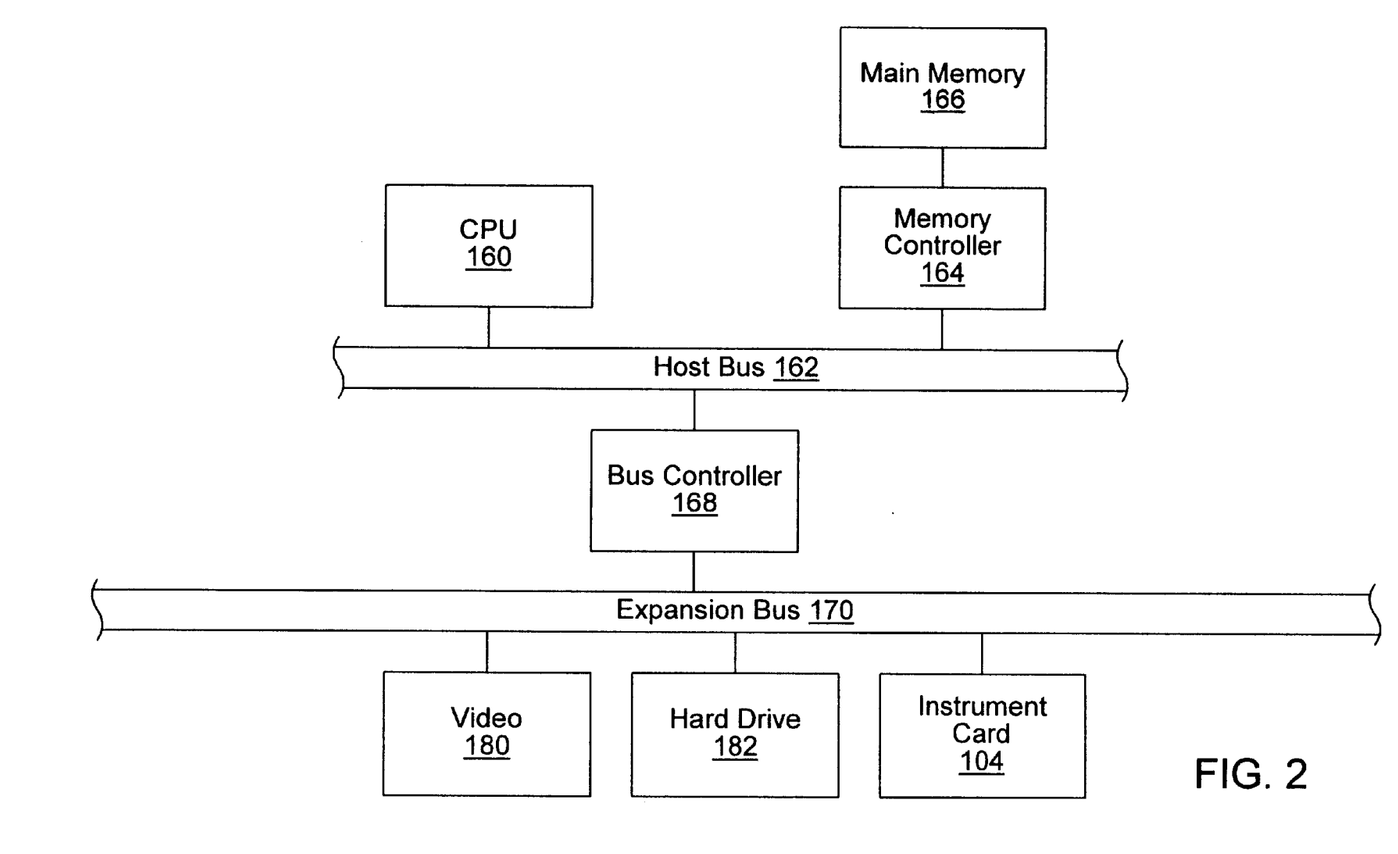
FIG. 2 is a block diagram illustrating the computer system in the instrumentation system of FIG. 1.

FIG. 2 is an exemplary block diagram of the computer system 102 of FIG. 1. The elements of a computer not necessary to understand the operation of the present invention have been omitted for simplicity. Also, the computer 102 may have various architectures.

The computer 102 includes at least one central processing unit or CPU 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164.

The main memory 166 may store an autoranging software program for configuring a measurement device to a correct measurement range according to the present invention. Main memory 166 may also store application software for controlling the instrumentation system. The main memory 166 also preferably stores operating system software as well as other software for operation of the computer system, as well known to those skilled in the art. Alternatively, the autoranging software program may reside in memory of the device 104 or at another location, as desired.

The host bus 162 is coupled to an expansion or input/output bus 170 by means of a bus controller 168 or bus bridge logic. The expansion bus 170 is preferably the PCI (Peripheral Component Interconnect) expansion bus, although other bus types can be used. The expansion bus 170 includes slots for various devices, such as the instrumentation board 104. The instrumentation board 104 may comprise a data acquisition board, a multimeter board, i.e., a board which implements multimeter functions, an oscilloscope board, or other type of instrumentation board. The computer 102 may further comprise a video display subsystem 180 and hard drive 182, which may be coupled to the expansion bus 170.

As noted above, the instrumentation device 104 receives measurements of signals including an initial measurement. As also noted above, the system and method of configuring a measurement device to a correct measurement range may be included in any of various systems. Thus FIGS. 1 and 2 illustrate one example of the use of the present invention.

Figure 3:
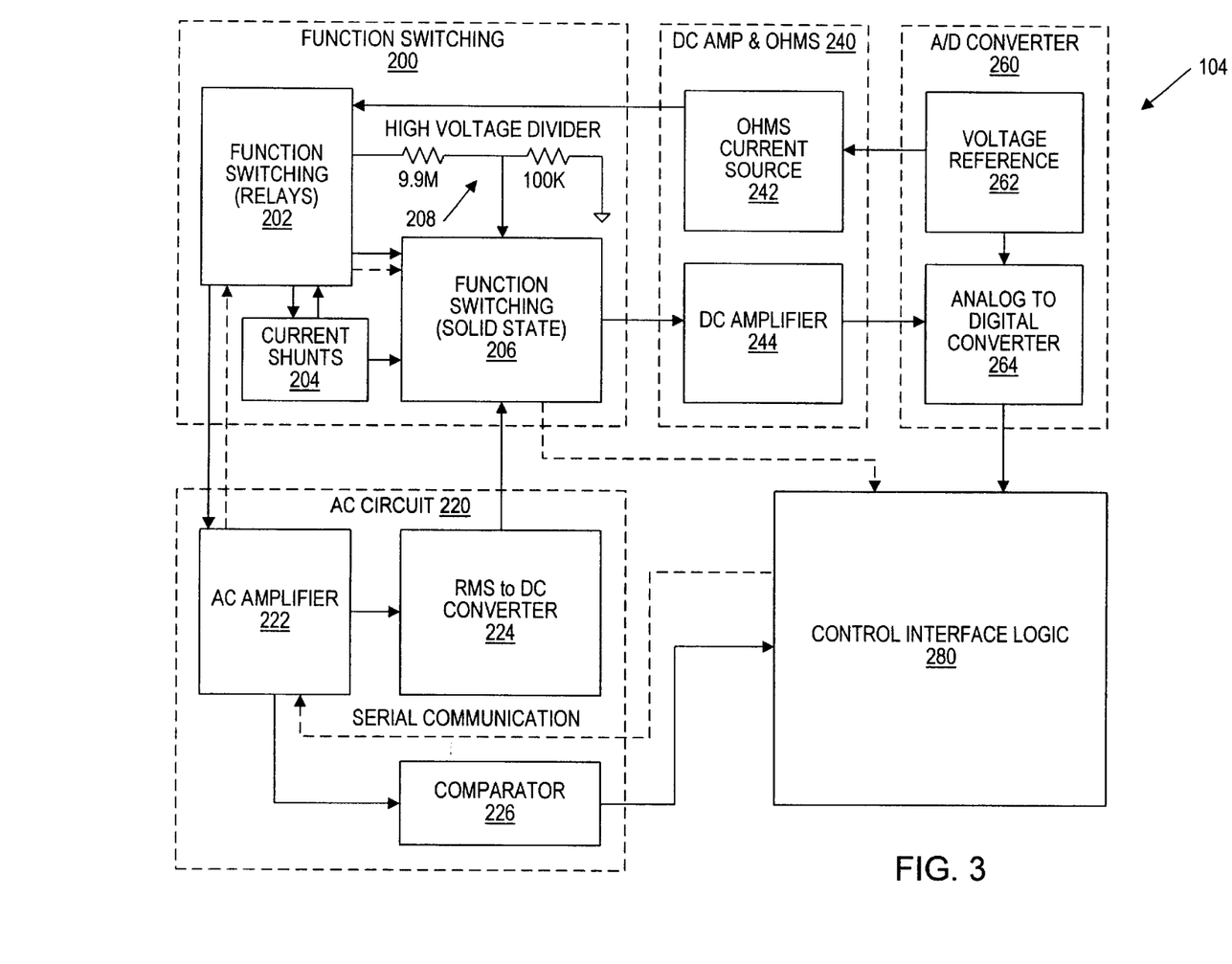
FIG. 3 is a block diagram of the instrumentation device of FIG. 2.

FIG. 3 is a block diagram illustrating a portion of the instrumentation device 104 of FIG. 2 in one embodiment, wherein the instrumentation device 104 is a multimeter. It is noted that FIG. 3 is exemplary only, and the instrumentation device 104 may have various architectures or forms, as desired.

As shown, the instrumentation device 104 may include a function switching block 200, an AC circuit 220, a DC amplifier and ohm block 240, an A/D converter block 260 and control interface logic 280.

The function switching block 200 operates to switch between the various functions performed by the multimeter, such as voltage measurement, current measurement, DC/AC measurements, etc. The function switching logic 200 includes a function switching block 202 comprising a plurality of relays. The function switching block 202 couples to a high voltage divider 208. The function switching block 202 also couples to current shunts 204. The current shunts block 204 couples to function switching logic 206, which preferably comprises solid state logic.

The function switching block 202 also couples to the AC circuit 220. More specifically, the function switching block 202 couples to an AC amplifier 222. The AC amplifier provides an output to a comparator 226. The comparator 226 in turn provides an output to the control interface logic 280. The AC amplifier 222 is also preferably in serial communication with the control interface logic 280. The AC amplifier 222 also provides an output to an RMS to DC converter 224. The RMS to DC converter 224 operates to convert the root-mean-square (RMS) amplitude of an AC signal to a DC value. The RMS to DC converter 224 provides its output to the solid state function switching logic 206.

As shown, the instrumentation device 104 also includes the DC amplifier and ohm section 240. This block includes an ohms current source 242 and a DC amplifier 244.

The instrumentation device 104 also includes the A/D converter block 260. The A/D converter block 260 includes a voltage reference block 262 and an analog to digital (A/D) converter 264 according to the present invention.

The voltage reference block 262 provides an output to the ohms current source block 242 which in turn provides an output to the function switching relays 202. The solid state function switching block 206 receives an output from the high voltage divider 208 as well as from the relay function switching logic 202 and the current shunts 204 and provides an output to the DC amplifier 244 which in turn provides an output to the A/D converter 264. The solid state function switching block 206 and the A/D converter 264 are also coupled to the control interface logic 280.

The control interface logic 280 includes logic for controlling access to the computer display for displaying the acquired signals. For example, the control interface logic 280 includes expansion bus interface logic, e.g., PCI bus interface logic, for interfacing to the PCI expansion bus 170.

Figure 4:
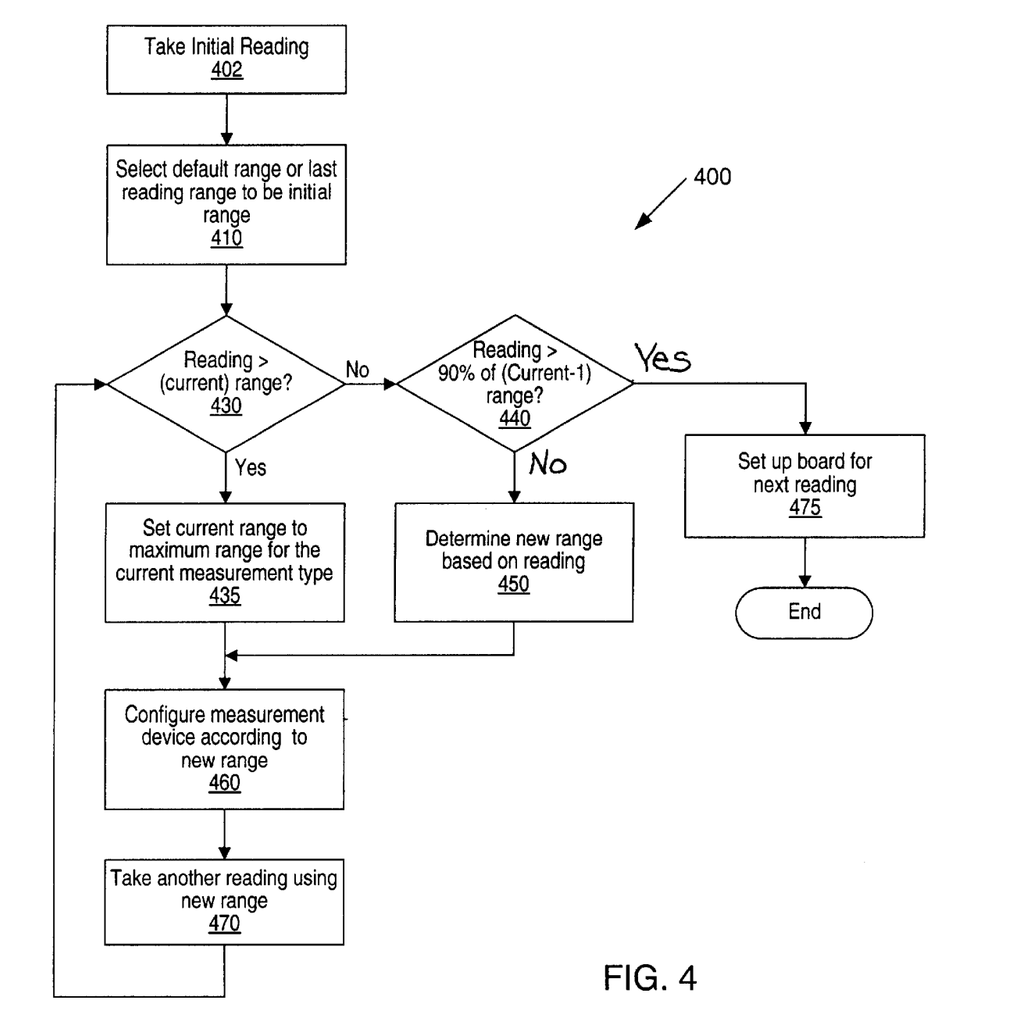
FIG. 4 is a flowchart depicting a method of an embodiment of the present invention.

FIG. 4 is a flowchart depicting a method 400 of configuring a measurement device to a correct measurement range according to an embodiment of the present invention. The method is preferably implemented by a software program stored in the memory 166.

In step 402, an initial measurement may be taken by the device 104. The initial measurement becomes the current measurement.

In step 410, the initial measurement range may be selected. The initial measurement range becomes the current measurement range. The initial measurement range may be either a default measurement range, e.g. the highest measurement range, or the last measurement range of the measuring device 104, or a user selected measurement range.

In step 430, a comparison is made between the current measurement or reading and the current measurement range. If the current measurement is greater that the current measurement range, i.e., if the initial measurement or reading is greater than or equal to the upper voltage of the current measurement range, then the reading is presumed inaccurate, since the current range was not sufficiently large to properly read the measurement. In this case, in step 435 the method then sets the current range to the maximum range for the current measurement type. Setting the current range to the maximum range ensures that the next reading will be a valid reading. The method then configures the measurement device according to the new range in step 460 and takes another reading using the new range in step 470. Operation then returns to step 430.

If the initial measurement or reading is less than the upper voltage of the current measurement range as determined in step 430, then in step 440 the method determines if the reading is greater than a predetermined fraction of the next lower measurement range, e.g., 90% of the (current-1) measurement range. A pre-determined fraction of the next lower measurement range is used to provide a margin for error. In the preferred embodiment, the predetermined fraction is 90%, although other fractions may be used.

If the reading is greater than 90% of the (current-1) measurement range as determined in step 440, then the current measurement range is determined to be the correct measurement range for the initial measurement. Thus, if the reading is less than the current measurement range and greater than 90% of the (current-1) measurement range, then the current measurement range is determined to be the correct measurement range. In this case, the measurement device is already configured at the correct measurement range, e.g., a default measurement range. The board may then be set up for the next reading in step 475, and operation completes at step 480.

If the reading is not greater than 90% of the (current-1) measurement range as determined in step 440, then the current measurement range is not the correct measurement range for the initial measurement.

In this case, in step 450 a new measurement range is determined based on the initial or current measurement. The new measurement range is intelligently determined based on the initial reading, preferably by software executing in the computer system. The process of determining a new measurement range is preferably to take the initial reading and compare it to a certain percentage, such as 90%, of the next smaller measurement range with respect to the (current-1) measurement range. The next smaller measurement range with respect to the (current-1) measurement range is the (current-2) measurement range. If the initial reading is less than 90% of this next smaller measurement range, then the initial reading is compared to 90% of the following smaller measurement range. The process continues until the initial reading is not less than 90% of a measurement range. When that occurs, the next higher measurement range with respect to that measurement range becomes the new measurement range. The above process is preferably performed in software to intelligently determine the correct measurement range based on the initial reading.

For example, a measuring device may have five voltage measurement ranges such as a 0.02 volt, 0.2 volt, 2 volt, 25 volt and a 250 volt range. Suppose the measuring device takes an initial measurement of a signal which measures 1.7 volts. Suppose further that the current measurement range is the 250 volt measurement range. Two conditions are examined to determine whether the current measurement range is the correct measurement range, these being that the reading should be less than the current measurement range and greater than 90% of the (current-1) measurement range. The (current-1) measurement range is the next smaller measurement range with respect to the current measurement range. In the example, 1.7 volts is less than the (current-1) measurement range, i.e., 25 volts. Therefore, the 250 volt measurement range is not the correct measurement range. Since the current measurement range is not the correct measurement range, a new measurement range is determined based on the initial measurement. As described above, the process of determining new measurement range iteratively compares the reading with 90% of subsequently smaller measurement ranges until the initial reading is not less than 90% of a measurement range. In this example, that would occur with a measurement range of 0.2 volts. That is, 1.7 volts exceeds 0.90 times 0.2 volts. When that occurs, the measurement range above the 0.2 measurement range, i.e., the 2 volt range, becomes the new measurement range, and the measurement device is set according to the new measurement range.

The measurement device then configures the measurement device according to the new measurement range in step 460 and preferably takes another reading of the signal in the new measurement range in step 470, e.g., the 2 volt measurement range, to verify that the new measurement range is the correct measurement range.

Normally, the new measurement range determined in step 450 is the correct measurement range. Occasionally, because of an offset in the measurement device, the new measurement range is not the correct measurement range and the above process may repeat one more time, as determined by step 430. Step 430 may be performed again with the new measurement range becoming the current measurement range and the new measurement becoming the current measurement.

The comparisons in steps 430 and 440 essentially determine if the current measurement range is the correct measurement range. If the current measurement is less than the current measurement range and greater than 90% of the (current-1) measurement range, then the current measurement range is the correct measurement range, and operation completes with steps 475 and 480. When steps 475 and 480 are reached, the measurement device is configured to the correct measurement range.

Thus the system operates to reach the final or correct measurement range with no more than 3 readings (measurements), and typically with two readings (measurements).

The following example illustrates the method 400 for automatically configuring a measurement device to a correct measurement range.

Suppose a measuring device has five voltage measurement ranges such as a 0.02 volt, 0.2 volt, 2 volt, 25 volt and a 250 volt range. The default measurement range may be set to the 250 volt range. In step 402 the measuring device takes an initial measurement of a signal. In step 410 the initial measurement range may be set to be the default measurement range, i.e., the 250 volt range. Suppose the initial measurement of a signal measures 1.7 volts. In step 430, the initial measurement, i.e., the current measurement, is compared to the initial measurement range, i.e., the current measurement range. Since the current measurement is less than the current measurement range, i.e., 1.7 volts is less than 250 volts, and is less than the (current-1) measurement range, i.e., 1.7 volts is less than 25 volts, the method 400 proceeds to step 450.

Since the current measurement range is not the correct measurement range, a new measurement range is determined based on the current measurement in step 450. The process of determining a new measurement range is to take the current reading and compare it to a certain percentage, such as 90%, of the next smaller measurement range with respect to the current measurement range, i.e., the 2 volt range. If the initial reading is less than 90% of the next smaller measurement range, then the initial reading is compared to 90% of the following smaller measurement range. The process continues until the initial reading is not less than 90% of a measurement range. That would occur with a measurement range of 0.2 volts. When that occurs, the measurement range of 2 volts becomes the new measurement range and the measurement device is configured according to the new measurement range in step 460.

The measurement device 104 then takes another reading, the second reading, of the signal in the new measurement range, the 2 volt measurement range, to verify that the new measurement range is the correct measurement range in step 470. The method 400 loops back to step 430. Normally, the new measurement range is the correct measurement range and hence method 400 ends at steps 475 and 480.

Occasionally, because of an offset in measuring the signal, the new measurement range is not the correct measurement range. Consequently, steps 450, 460 and 470 may be repeated one more times. For instance, in the example above, suppose that the second reading of the signal is 2.02 volts, which is outside the 2 volt measurement range. Since the second reading is greater than the 2 volt measurement range, then method 400 proceeds to step 450. In step 450, a second new measurement range is determined based on the second reading. Because 2.02 volts is outside the 2 volt measurement range, a new measurement is taken at the highest measurement range. The reason is because the measurement device cannot measure the signal that is outside a measurement range and hence the measurement device was not able to accurately measure the signal. The measurement device compares the measurement of 2.02 volts with the highest measurement range. If the new measurement is less than 90% of the highest measurement range, then the new measurement is compared to 90% of the following smaller measurement range. The process continues until the new measurement is not less than 90% of a measurement range. That would occur with a measurement range of 2 volts. When that occurs, the measurement range of 25 volts becomes the new measurement range and the measurement device is configured according to the new measurement range in step 460.

A third reading may then be taken using the new measurement range, i.e., the 25 volt measurement range, in step 470. The method 400 then loops back to step 430. Since the third reading will be less than the current measurement range, i.e., the 25 volt measurement range, the method 400 proceeds to step 440. Since the third reading will be greater than the (current-1) measurement range, i.e., the 2 volt measurement range, the method 400 ends at steps 475 and 480. In one embodiment, the process of determining a new range based on a reading may only need to be repeated once to ensure that the measurement range is the correct measurement range.

In one embodiment, where a device has more than one channel and has an autoranging capability as described above, the device may operate to maintain or store the last used range on a channel-by-channel basis. Thus the last range used for a channel may be stored in memory for each of the plurality of channels. This allows the device to more quickly return to the last range for a respective channel, thus allowing quicker autoranging for each channel.

Numerous variations and modifications will become apparent to those skilled in the art once the above disclosure is fully appreciated. It is intended that the following claims be interpreted to embrace all such variations and modifications.

What is claimed is:

1. A method for automatically configuring a measurement device to a correct measurement range, comprising:

receiving a first measurement;

comparing the first measurement with a first measurement range;

determining if the first measurement range is the correct measurement range in response to said comparing;

determining a new measurement range based on the first measurement if the first measurement range is not the correct measurement range, wherein said determining comprises comparing the first measurement with one or more smaller measurement ranges to determine the new measurement range;

wherein said comparing, said determining if the first measurement is in the correct measurement range, and said determining a new measurement range are automatically performed in response to receiving the first measurement.

2. The method as recited in claim 1, wherein said determining a new measurement range based on the first measurement comprises:

iteratively comparing the first measurement with the one or more smaller measurement ranges until a final measurement range is identified, such that the first measurement is greater than a certain percentage of the final measurement range;

wherein the new measurement range is a next higher measurement range relative to the final measurement range.

3. The method as recited in claim 2, wherein said iteratively comparing is performed in software.

4. The method as recited in claim 1, wherein the new measurement range is identified when the first measurement is greater than a certain percentage of a next smaller measurement range relative to the new measurement range.

5. The method as recited in claim 1, wherein said determining a new measurement range based on the first measurement comprises:

comparing the first measurement with a next smaller measurement range relative to the first measurement range;

(a) wherein if the first measurement is less than a certain percentage of the next smaller measurement range, then:

(a)(1) comparing the first measurement with a following smaller measurement range relative to the next smaller measurement range;

(b) wherein the following smaller measurement range becomes the next smaller measurement range and steps (a)–(b) are performed one or more times until the first measurement is greater than a certain percentage of the next smaller measurement range; wherein, when the first measurement is greater than a certain percentage of the next smaller measurement range, then the new measurement range is a next higher measurement range with respect to the next smaller measurement range.

6. The method as recited in claim 1, wherein said determining a new measurement range based on the first measurement comprises:

determining if the first measurement is greater than the first measurement range;

wherein, if the first measurement is greater than the first measurement range, then the method comprises:

adjusting the first measurement range to be a highest measurement range of the measurement device; and receiving a second measurement, comparing the second measurement with the highest measurement range, determining if the highest measurement range is the correct measurement range in response to said comparing, and determining a new measurement range based on the second measurement if the highest measurement range is not the correct measurement range;

wherein, if the first measurement is less than the first measurement range, then the method comprises:

comparing the first measurement with one or more smaller measurement ranges until a final measurement range is identified, such that the first measurement is greater than a certain percentage of the final measurement range;

wherein the new measurement range is a next higher measurement range relative to the final measurement range.

7. The method as recited in claim 1, wherein the method further comprises:

receiving a second measurement using the new measurement range;

determining if the new measurement range is the correct measurement range in response to the second measurement.

8. The method as recited in claim 7, wherein the method further comprises:

determining a second new measurement range based on the second measurement if the new measurement range is not the correct measurement range; and configuring the measurement device with the second new measurement range after said determining the second new measurement range.

9. The method as recited in claim 7, wherein the method further comprises:

configuring the measurement device with the new measurement range if the new measurement range is determined to be the correct measurement range in response to the second measurement.

10. The method as recited in claim 7, wherein said determining a new measurement range is repeated at most one time.

11. The method as recited in claim 6, wherein the first measurement range is not the correct measurement range if:

the first measurement is greater than the first measurement range; or the first measurement is less than a pre-determined percentage of the next lower measurement range.

12. The method as recited in claim 6, wherein the correct measurement range is a range where measurements are less than the correct measurement range and are greater than a pre-determined percentage of the next lower measurement range.

13. The method as recited in claim 6, wherein the first measurement range is one of a default measurement range or a last measurement range.

14. The method as recited in claim 1, wherein the new measurement range is designated as the correct measurement range, the method further comprising:

configuring the measurement device with the new measurement range after said determining the new measurement range based on the first measurement.

15. The method as recited in claim 14, further comprising:

configuring the measurement device with the first measurement range if the first measurement range is the correct measurement range.

16. The method as recited in claim 1, wherein the method is implemented by a measurement system comprising the measurement device and a computer system;

wherein the computer system automatically performs said comparing, said determining if the first measurement is in the correct measurement range, and said determining a new measurement range in response to receiving the first measurement.

17. The method as recited in claim 1, wherein the measurement device includes a plurality of channels;

the method further comprising maintaining information regarding a last used range on a channel-by-channel basis for each of the plurality of channels;

wherein said information regarding the last used range is useable in returning to a last range for a respective channel for faster autoranging of the respective channel.

18. A measurement system which performs autoranging on a measurement device, comprising:

a measurement device for measuring signals, wherein the measurement device includes a plurality of measurement ranges;

a computer system coupled to the measurement device, wherein the computer system includes a memory medium and a processor coupled to the memory medium, wherein the memory medium stores an autoranging software program for configuring the measurement device with a correct measurement range;

wherein the measurement device is operable to receive a first measurement;

wherein, in response to the first measurement, the processor is operable to execute the autoranging software program to:

compare the first measurement with a first measurement range;

determine if the first measurement range is the correct measurement range in response to the comparison; and determine a new measurement range based on the first measurement by comparing the first measurement with a next smaller measurement range relative to the first measurement range if the first measurement range is not the correct measurement range.

19. The measurement system as recited in claim 18, wherein, in determining a new measurement range based on the first measurement, the processor is operable to execute the autoranging software program to:

iteratively compare the first measurement with one or more smaller measurement ranges until a final measurement range is identified, such that the first measurement is greater than a certain percentage of the final measurement range;

wherein the new measurement range is a next higher measurement range relative to the final measurement range.

20. The measurement system as recited in claim 18, wherein, in determining a new measurement range based on the first measurement, the processor is operable to execute the autoranging software program to:
  compare the first measurement with one or more smaller measurement ranges to determine the new measurement range, wherein the hew measurement range is identified when the first measurement is greater than a certain percentage of a next smaller measurement range relative to the new measurement range.

21. The measurement system as recited in claim 18, wherein, in determining a new measurement range based on the first measurement, the processor is operable to execute the autoranging software program to:
  compare the first measurement with the next smaller measurement range relative to the first measurement range;
  (a) wherein if the first measurement is less than a certain percentage of the next smaller measurement range, then:
    (a)(1) compare the first measurement with a following smaller measurement range relative to the next smaller measurement range;
  (b) wherein the following smaller measurement range becomes the next smaller measurement range and (a)–(b) are performed one or more times until the first measurement is greater than a certain percentage of the next smaller measurement range;
  wherein, when the first measurement is greater than a certain percentage of the next smaller measurement range, then the new measurement range is a next higher measurement range with respect to the next smaller measurement range.

22. The measurement system as recited in claim 18, wherein, in determining a new measurement range based on the first measurement, the processor is operable to execute the autoranging software program to:
  determine if the first measurement is greater than the first measurement range;
  wherein, if the first measurement is greater than the first measurement range, then the processor is operable to execute the autoranging software program to:
    adjust the first measurement range to be a highest measurement range of the measurement device;
    receive a second measurement;
    compare the second measurement with the highest measurement range;
    determine if the highest measurement range is the correct measurement range in response to said comparison; and
    determine a new measurement range based on the second measurement if the highest measurement range is not the correct measurement range, wherein, in determining a new measurement range, the processor is operable to execute the autoranging software program to:
      compare the second measurement with one or more smaller measurement ranges until a final measurement range is identified, such that the second measurement is greater than a certain percentage of the final measurement range;
      wherein the new measurement range is a next higher measurement range relative to the final measurement range.

23. The measurement system as recited in claim 18, wherein the processor is operable to execute the autoranging software program to further:
  configure the measurement device with the new measurement range after determining the new measurement range based on the first measurement.

24. The measurement system as recited in claim 18, wherein the processor is operable to execute the autoranging software program to further:
  configure the measurement device with the first measurement range if the first measurement range is the correct measurement range.

* * * * *